United States Patent
Tanaka et al.

(10) Patent No.: US 7,341,786 B2
(45) Date of Patent: Mar. 11, 2008

(54) INDIUM-CONTAINING WAFER AND METHOD OF ITS MANUFACTURE

(75) Inventors: So Tanaka, Itami (JP); Takashi Iwasaki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/492,694

(22) PCT Filed: Jul. 17, 2003

(86) PCT No.: PCT/JP03/09124

§ 371 (c)(1),
(2), (4) Date: Apr. 12, 2004

(87) PCT Pub. No.: WO2004/001049

PCT Pub. Date: Jan. 29, 2004

(65) Prior Publication Data

US 2004/0248385 A1    Dec. 9, 2004

(30) Foreign Application Priority Data

Jul. 24, 2002  (JP)  ............................. 2002-215456

(51) Int. Cl.
    *B32B 9/00*   (2006.01)
(52) U.S. Cl. ..................... 428/446; 428/450; 428/704; 257/E33.06; 257/E33.076
(58) Field of Classification Search ................ 428/446, 428/704, 450
    See application file for complete search history.

(56) References Cited

U.S. PATENT DOCUMENTS

| 5,387,796 | A | * | 2/1995 | Joshi et al. | ............ | 250/370.12 |
| 5,477,066 | A | * | 12/1995 | Nakanishi | ................. | 257/197 |
| 5,689,358 | A | * | 11/1997 | Nakao et al. | ............... | 359/248 |
| 5,843,849 | A | * | 12/1998 | Hoshino et al. | ........... | 438/738 |
| 6,151,351 | A | * | 11/2000 | Kito et al. | .................... | 372/96 |
| 6,194,747 | B1 | * | 2/2001 | Onda | ........................ | 257/192 |

FOREIGN PATENT DOCUMENTS

| JP | S53-059376 A | 5/1978 |
| JP | H09-181349 A | 7/1997 |

OTHER PUBLICATIONS

C. J. Sa and L. G. Meiners, "Schottky barrier heights of Hg, Cd, and Zn on n-type InP(100)," Appl. Phys. Lett. 48 (26), Jun. 30, 1986, American Institute of Physics pp. 1796-1798.
John D. Wiley and G. L. Miller, "Series Resistance Effects in Semiconductor CV Profiling," IEEE Transactions on Electron Devices, vol. ED-22, No. 5, May 1975, pp. 265-272.
H. Doi, et al., "Highly uniform 4-inch diameter InGaAs/InP epitaxial wafer for PIN-PD application," Conference Proceedings, 14th Indium Phosphide and Related Materials Conference, May 12-16, 2002, Stockholm, Sweden, pp. 635-638.
SSM Japan K.K., "Chapter 5: Carrier Density Measurement of Epitaxial Wafer-Mercury Probe," Seminar Text of CV/IV Technique, Oct. 2001, published by Solid State Measurements, Inc., p. 5-12, p. 5-24.

* cited by examiner

*Primary Examiner*—Jennifer C. McNeil
*Assistant Examiner*—Timothy M. Speer
(74) *Attorney, Agent, or Firm*—James Judge

(57) ABSTRACT

An indium-containing wafer from which removal of mercury can be reliably performed and a method of manufacturing such a wafer are provided in order to make the mercury C-V method, allowing characteristics of a the indium-containing wafer to be measured with high precision and being a non-destructive test, viable. An indium-containing wafer relating to the present invention is characterized by having, formed on its episurface layer, an added-on mercury-removal layer directed to removing wafer-surface adherent mercury and composed of a compound semiconductor. In addition, a method of manufacturing an indium-containing wafer relating to the present invention is characterized in that after evaluating electrical characteristics of the wafer with, as an electrode, mercury adhered onto the surface of the mercury-removal layer, the superficially adhered mercury is eliminated by removing the mercury-removal layer.

3 Claims, 7 Drawing Sheets

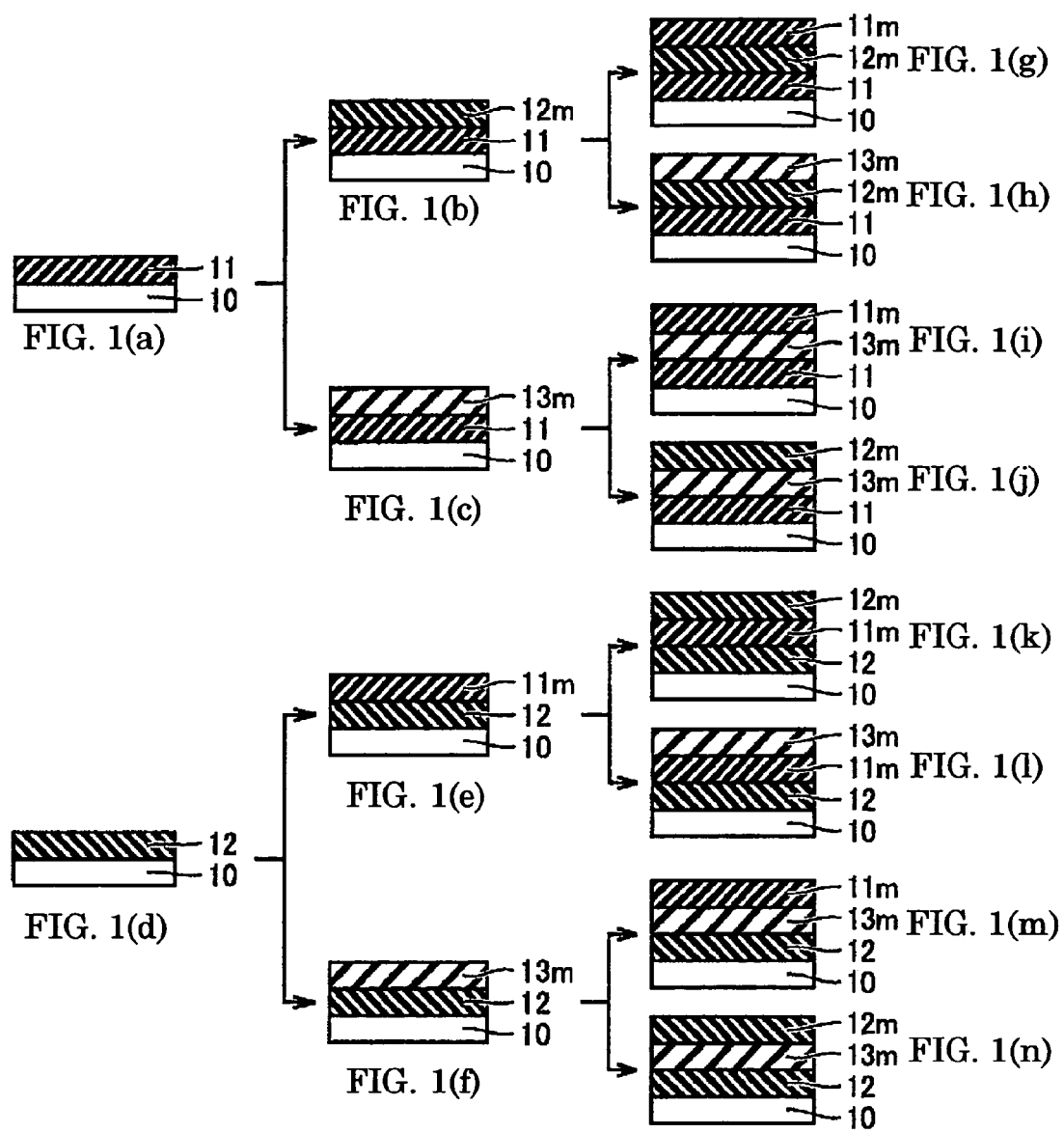

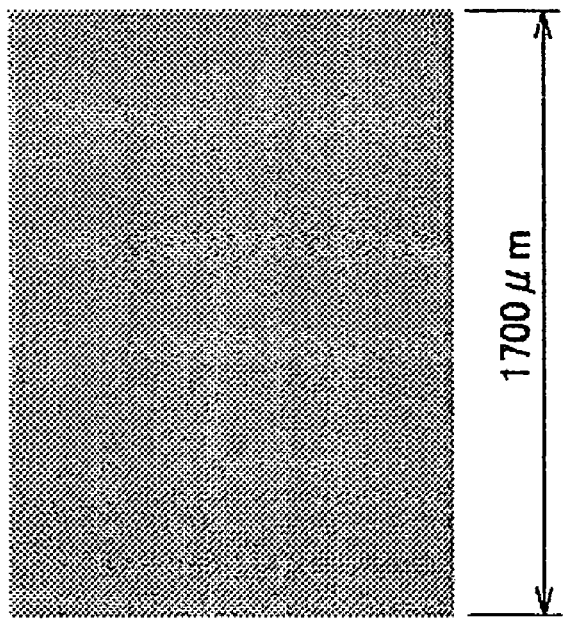
FIG. 6(b)
1700 μm
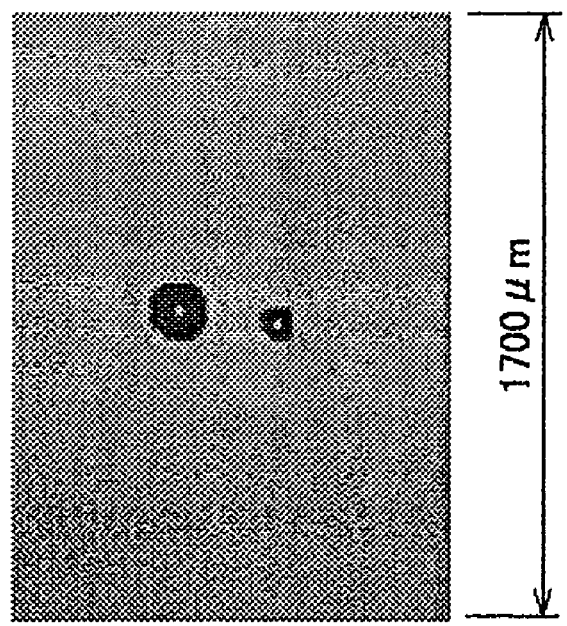
FIG. 6(a)
1700 μm

INDIUM-CONTAINING WAFER AND METHOD OF ITS MANUFACTURE

TECHNICAL FIELD

The present invention relates to indium-containing wafers, and more particularly to indium-containing wafers the surface of which has a mercury-removal layer for removing mercury adhered to the surface of the mercury-removal layer on the wafer for evaluating its electrical characteristics non-destructively, and to methods of manufacturing such wafers.

BACKGROUND ART

Indium-containing wafers are widely used for photodetectors such as pin photodiodes and avalanche photodiodes, light-emitting elements such as laser diodes, and electronic devices such as field-effect transistors and bipolar transistors. In order to comprehend the semiconductor characteristics of such indium-containing wafers, evaluating characteristics of the wafers in terms of density, thickness, and crystallinity is crucial.

With regard to evaluating such characteristics, capacitance-voltage measurement (hereinafter referred to as "C-V measurement") has been employed for evaluating carrier density in and thickness of wafers; however, the mainstream C-V measurement to date has been the SPA (semiconductor profile analyzer) method. Due to the fact that the SPA method is one in which the C-V measurement is carried out while the wafer is being etched through its surface with an electrolyte, which is a solution, as an electrode, problems with the method have been errors in the carrier density measurement, associated with fluctuations in the area of wafer contact with the electrolyte, and degradation in depth accuracy owing to etching unevenness; in addition, with the method being essentially a destructive test only spot checks can be made and thus, measuring the carrier density and thickness of those wafers that are themselves offered as manufactured articles has not been possible.

In contrast, the mercury C-V method—in which the C-V measurement is carried out by providing a mercury electrode on the episurface of the wafer to employ a mercury-metal-compound-semiconductor Schottky barrier—is free from the problems of errors in carrier density measurement and degradation in accuracy with the SPA method; moreover, there is no surface etching with the mercury C-V method, which means that with mercury that has been adhered to the wafers as an electrode having been removed, wafers whose carrier density and thickness have been measured can be offered as manufactured articles. Furthermore, an advantage with the mercury C-V method is that, in addition to the C-V measurement a current-voltage measurement (hereinafter referred to as an "I-V measurement") can be made, making it possible to gain insight into crystallinity. Nevertheless, hazards to the human body and global environment are feared, in addition to the problem of degradation in wafer characteristics, lest mercury be extant on wafers following mercury C-V measurement.

DISCLOSURE OF INVENTION

An object of the present invention is to solve the foregoing problems and make available an indium-containing wafer from which removal of mercury can be reliably performed, and to afford a method of manufacturing such a wafer, in order to make the mercury C-V method, which allows characteristics of a target indium-containing wafer to be measured with high precision and is a non-destructive test, viable.

In order to accomplish the foregoing objective, an indium-containing wafer having to do with the present invention is characterized in having an added-on mercury-removal layer composed of a compound semiconductor formed on its episurface layer. In addition, for the mercury-removal layer, a chemical mercury-removal layer with which, being soluble in a mercury-solvent removing solution, the mercury and the mercury-removal layer together are cleared away, may be utilized; a physical mercury-removal layer with which, being soluble in a removing solution in which mercury does not dissolve or in a removing solution in which mercury dissolves with difficulty, mercury is cleared away by the mercury-removal layer being removed altogether, may be utilized. This is because in either case mercury adhering to the mercury-removal layer can be reliably removed due to dissolution of the mercury-removal layer into the removing solution.

Furthermore, an indium-containing wafer having to do with the present invention may be characterized in having two or more laminae, and in that the etching speed, in respect of a removing solution for the outside mercury-removal lamina, of the inside mercury-removal lamina is $1/10$ or less that of the outermost mercury-removal lamina. This is because the removal of mercury is made still more reliable by the multi-stage mercury-removal procedure, and diversified removal layers can be designed.

In addition, a method of manufacturing an indium-containing wafer having to do with the present invention is characterized by providing a mercury-removal layer on an episurface of the wafer, and after evaluating electrical characteristics of the wafer, with mercury adhered onto the mercury-removal layer being part of an electrode, removing the adhered mercury by clearing away the mercury-removal layer. Also, the mercury-removal layer may be furnished bi-or-more-laminarly.

Herein, the electrical characteristics evaluation may be an evaluation of either the carrier density or the thickness of the wafer by means of a C-V measurement technique, or may be an evaluation of either the dark current or the breakdown voltage of the wafer by means of an I-V measurement technique.

BRIEF DESCRIPTION OF DRAWINGS

FIG. 1 is a conceptual diagram of the design of mercury-removal layers;

FIG. 6 is microphotographs respectively showing the episurface layer of an indium-containing wafer (a) prior to and (b) subsequent to a mercury removal operation (etching);

BEST MODE FOR CARRYING OUT THE INVENTION

Figure 2A:
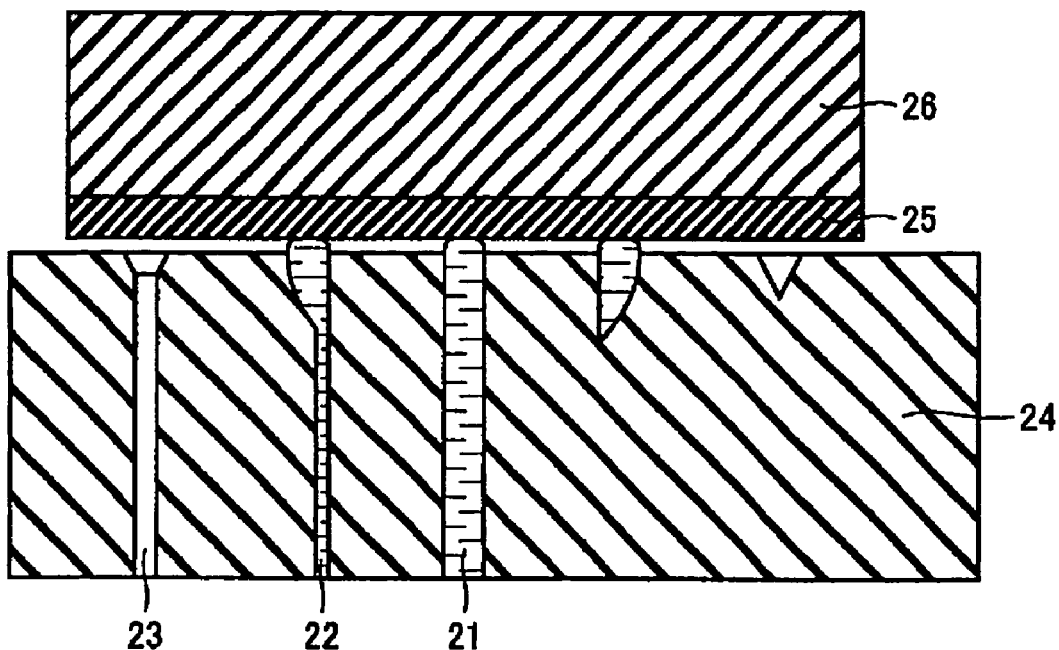
FIG. 2 is schematic views of a mercury electrode part for mercury C-V measurement, wherein (a) is a schematic sectional view of the entire electrode part, and (b) is a schematic view of the mercury electrode surface.

A "mercury-removal layer" In the present invention refers to a compound semiconductor formed on a wafer episurface layer with the object of removing mercury adhering to the surface of the mercury-removal layer. Mercury-removal layers as termed herein cover chemical mercury-removal layers and physical mercury-removal layers.

A chemical mercury-removal layer means a layer in which, being soluble in a mercury-dissolving removing solution, the mercury-removal layer is dissolved away together with mercury; and although it is not particularly limited the layer may be, to name examples, an In—As-based compound semiconductor such as InAlAs, InGaAs, or InGaAs(P), in cases where an acid such as nitric acid, sulfuric acid, or phosphoric acid+aqueous hydrogen peroxide is the removing solution. "InGaAs(P)" herein refers to a compound having an As/(As+P) mole ratio of 0.5 or greater. For example, the As/(As+P) mole ratio of an InGaAs(P) layer lattice-matched with an InP (001) substrate and of 1.3 μm emission-wavelength design is 0.6 to 0.7, which falls into the foregoing range.

In turn, a physical mercury-removal layer means a layer in which, being soluble in a removing solution that does not dissolve mercury (which covers—likewise hereinafter—removing solutions that do not readily dissolve mercury), mercury is cleared away by the mercury-removal layer being dissolved off altogether. Although it is not particularly limited the layer may be, to name examples, an In—P-based compound semiconductor such as InP or InGaP(As) in cases where the removing solution is hydrochloric acid or the like, or an Si-based compound semiconductor such as SiN, $SiO_2$, and SiON in cases where the removing solution is an acid such as hydrofluoric acid, hydrofluoric acid+ammonium fluoride, or hydrofluoric acid+aqueous hydrogen peroxide.

Herein, "InGaP(As)" refers to compounds having a P/(P+As) mole ratio of greater than 0.5. For example, the P/(P+As) mole ratio of an InGaP(As) layer lattice-matched with an InP(001) substrate and of 1.0 μm emission-wavelength design is 0.7 to 0.9, which falls into the foregoing range.

The compounds listed above as examples of Si-based compound semiconductors are ordinarily taken to be insulators, but may be utilized for the mercury-removal layer of the present invention since even with a layer of such a compound provided on the episurface layer of an indium-containing wafer the mercury C-V measurement can be made without hindrance. From this perspective, in the present specification the above-listed Si-based compounds too are regarded as semiconductors having a large energy gap and treated as being included in Si-based compound semiconductors.

It should be noted that when InGaAs(P) or InGaP(As) are utilized in combination, the relative etching speed with respect to the removing solution is preferably 10 times or greater. In order for this to be the case, it is preferable that the difference in As/(As+P) mole ratios or P/(P+As) mole ratios be 0.1 or greater. In this case, it is desirable that the mole ratios of In and Ga be adjusted according as the mole ratios of As and P, to lessen lattice mismatch with respect to the substrate.

Although the mercury-removal layer that is formed on the episurface layer of the indium-containing wafer is not particularly restricted, preferably selected is one with which the removing solution that clears away the mercury-removal layer does not dissolve the episurface layer. This is in order to prevent loss of the episurface layer. Herein, the episurface layer of the indium-containing wafer is in some cases In—P-based, while in others, In—As-based. Table I indicates the ease of solubility of mercury, In—P-based compound semiconductors, In—As-based compound semiconductors, and Si-based compound semiconductors in various removing solutions. Specifically, "O" in Table I indicates that the combination dissolves easily, whereas "X" indicates that the combination does not dissolve easily (is insoluble or dissolves with difficulty).

TABLE I

| | | Removing solution | | | | | | |
|---|---|---|---|---|---|---|---|---|
| | | $HNO_3$ | $H_2SO_4$ | $H_3PO_4 + H_2O_2$ | HCl | HF | HF + $NH_4F$ | HF + $H_2O_2$ |
| Mercury Mercury-removing layer | Hg | O | O | O | X | X | X | X |
| In-P-based | InP InGaP (As) | X | X | X | O | X | X | X |
| In-As-based | InAlAs InGaAs InGaAs (P) | O | O | O | X | X | X | O |
| Si-based | SiN $SiO_2$ SiON | X | X | X | X | O | O | O |

O: readily soluble
X: insoluble or dissolves with difficulty

"Ease of solubility" as termed herein means those compound semiconductors with which relative etching speed with respect to each removing solution is 10 times or greater under defined conditions. This is because in order to reliably remove mercury that has been adhered to the surface of an indium-containing wafer, the mercury-removal layer must be removed exclusively of the other wafer layers, and therefore a layer whose relative etching speed is less than 10 would be difficult to utilize as a mercury-removal layer.

FIG. 1 sets forth conceptual diagrams of mercury-removal layer designs. Those with a suffixed letter "m" after their reference numeral represent mercury-removal layers. Reference numeral 10 indicates a layer other than the episurface layer of the indium-containing wafer, reference numeral 11 an In—P-based compound semiconductor, reference numeral 12 an In—As-based compound semiconductor. Reference numeral 13m then denotes an Si-based compound semiconductor mercury-removal layer.

In cases where the episurface layer is In—P-based (11 in FIG. 1(a)), compound semiconductors that can be selected for the mercury-removal layer are those for which a removing solution that does not dissolve this episurface layer (which covers—likewise hereinafter—removing solutions that do not easily dissolve the episurface layer) is utilized, for example: an In—As-based compound semiconductor (12m in FIG. 1(b)) that uses as the removing solution an acid such as nitric acid, sulfuric acid, or phosphoric acid+aqueous hydrogen peroxide, or aqueous solutions thereof; and an Si-based compound semiconductor (13m in FIG. 1(c)) that uses as the removing solution an acid such as hydrofluoric acid, hydrofluoric acid+ammonium fluoride, or hydrofluoric acid+aqueous hydrogen peroxide, or aqueous solutions thereof. Herein, an In—As-based compound semiconductor amounts to a chemical mercury-removal layer, and an Si-based compound semiconductor to a physical mercury-removal layer.

In cases where the episurface layer is In—As-based (12 in FIG. 1(d)), compound semiconductors that can be selected for the mercury-removal layer are those for which a removing solution that does not dissolve this episurface layer is utilized, for example: an In—P-based compound semiconductor (11m FIG. 1(e)), with the removing solution being hydrochloric or like acid, or an aqueous solution thereof; and an Si-based compound semiconductor (13m in FIG. 1(f)), with the removing solution being hydrofluoric or like acid, hydrofluoric+ammonium fluoride or like acid, or an aqueous solution thereof. Herein, both an In—P-based compound semiconductor and an Si-based compound semiconductor amount to a physical mercury-removal layer. Various types of mercury-removal layers can be selected depending on the type of episurface layer in the indium-containing wafer and the type of cleaning solution, as just described.

A preferred aspect of the invention renders the mercury-removal layer twofold or more, with the layers selected being ones in which the etching speed, with respect to the removing solution for the outside mercury-removal layer, of the one-inside mercury-removal layer is 1/10 or less that of the etching speed of the outside mercury-removal layer. This aspect is preferable because it makes the removal of mercury more reliable, and serves to diversify the mercury-removal layers to facilitate architecting flexible manufacturing processes according to circumstances. Selection of layers with a relative etching speed of 1/100 or lower is a more preferable aspect, from the perspective of facility in manufacturing procedural operations.

FIG. 1 also illustrates outside mercury-removal layers selected with respect to the inside mercury-removal layer, in cases where the mercury-removal layer is twofold. For example, when the episurface layer of the indium-containing wafer is In—P-based (11 in FIG. 1(a)), the mercury-removal layer may for instance be an In—As-based (12m FIG. 1(b)) or Si-based (13m in FIG. 1(c)) compound semiconductor, as noted above; but these may be made an inside layer (inside mercury-removal layer), and further an outer-layer mercury-removal layer (outside mercury-removal layer) may be provided. In this case, the outside mercury-removal layer is selected so that the etching speed of the inside mercury-removal layer with respect to the removing solution for the outer layer is 1/10 or less relative to the outside mercury-removal layer. If an In—As-based compound semiconductor is to be an inside mercury-removal layer, an In—P-based compound semiconductor (11m in FIG. 1(g)) whose removing solution is hydrochloric or like acid, or aqueous solutions thereof, or an Si-based compound semiconductor (13m in FIG. 1(h)) whose removing solution is hydrofluoric or like acid, or aqueous solutions thereof, can be selected as the outside mercury-removal layer. If an Si-based compound semiconductor is to be the inside mercury-removal layer, an In—P-based compound semiconductor (11m in FIG. 1(i)) whose removing solution is hydrochloric or like acid, or aqueous solutions thereof, or an In—As-based compound semiconductor (12m in FIG. 1(j)) whose removing solution is nitric or like acid, or aqueous solutions thereof, can be selected as the outside mercury-removal layer.

Likewise, in cases where the episurface layer of the indium-containing wafer is In—As-based (12 in FIG. 1(d)), the mercury-removal layer may be, to name examples, In—P-based (11m FIG. 1(e)) or Si-based (FIG. 1(0, 13m) compound semiconductors, as noted above. In cases where an In—P-based compound semiconductor is to be an inside mercury-removal layer, an In—As compound semiconductor (12m in FIG. 1(k)) whose removing solution is nitric or like acid, or aqueous solutions thereof, or a Si-based compound semiconductor (13m in FIG. 1(l)) that whose removing solution is hydrofluoric or like acid, or aqueous solutions thereof, can be selected as the outside mercury-removal layer. Meanwhile, in cases where an Si-based compound semiconductor is to be an inside mercury-removal layer, an In—P-based compound semiconductor (11m in FIG. 1(m)) whose removing agent is hydrochloric or like acid, or aqueous solutions thereof, or an In—As-based compound semiconductor (12m in FIG. 1(n)) whose removing solution is nitric or like acid, or aqueous solutions thereof, can be selected as the outside mercury-removal layer.

It should be understood that when the mercury-removal layer is made threefold or more, a further outside mercury-removal layer can be chosen along the same lines as described above.

The method of furnishing a mercury removal layer on the episurface layer of an indium-containing wafer is not particular limited, and a variety of deposition methods may be used, such as a CVD (chemical vapor deposition) method, a MOCVD (metal-organic chemical vapor deposition) method, and a MBE (molecular beam epitaxy) method.

Figure 2B:
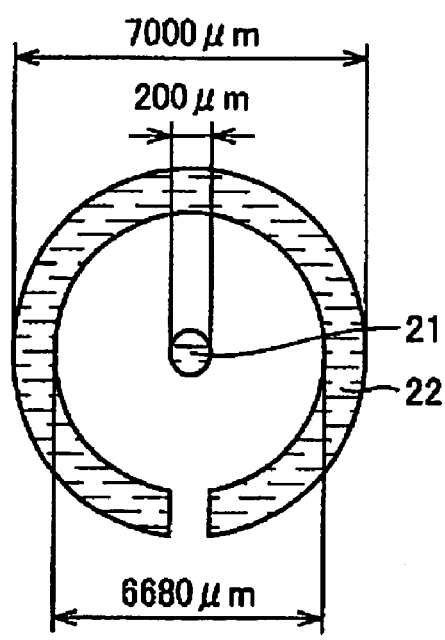

For the electrical characteristics of an indium-containing wafer, a C-V measurement or I-V measurement is carried out in the following manner, with, as an electrode, mercury that has been adhered to the surface of the mercury-removal layer. FIG. 2 sets forth schematic views or a mercury electrode part for mercury C-V measurement. In the figure (a) is a schematic cross-sectional view of the entire electrode part, and (b) is a schematic topside view of its inner-electrode and outer-electrode sections. The C-V measurement and I-V measurement are carried out on a stage 24 that is furnished with an inner mercury electrode 21, an outer mercury electrode 22, and a vacuum line 23. The ratio of the surface areas of the inner electrode and the outer electrode is 1:100.

The mercury C-V measurement is performed as follows. An indium-containing wafer 26 relevant to the present invention is brought so that its mercury-removal layer 25 comes into contact with the surface of the stage 24 having the inner electrode 21 and the outer electrode 22, which are filled with mercury and a vacuum is drawn using the vacuum line 23 to contact-adhere the mercury electrode surfaces and the mercury-removal layer surface.

By measuring the capacitance (C-V measurement) while voltage is applied to the indium-containing wafer, the carrier density N(w) of the indium-containing wafer at a depth w from the surface is evaluated using the following equation (1).

$$N(w) = (-C^6/q \in A^2)(dC/dV)^{-1} \quad (1)$$

Herein, C represents capacitance measured using a dc reverse bias voltage; q, the electron charge; $\in$, the dielectric constant; A, the measurement area; and dC, the change in capacitance with change in voltage dV. Then the depth w is found from the following equation (2).

$$w = \in A/C \quad (2)$$

Also, by measuring dark current generated when voltage is applied to the indium-containing wafer (I-V measurement), crystalline status of the wafer crystal can be evaluated from the fact that the greater the dark current is, the more the crystal defects.

After evaluating carrier density, thickness, crystalline status, and the like of the indium-containing wafer as just described, mercury that is extant on the mercury-removal layer is cleared away together with the mercury-removal layer using a removing solution, when the indium-containing wafer having the mercury-removal layer is withdrawn from the mercury electrode.

Where an In—P-based mercury-removal layer is to be removed, hydrochloric or like acid, or an aqueous solution thereof, is utilized. An example of the removing solution that may be given is an aqueous solution in which 36 mass % hydrochloric add is appropriately diluted.

Where an In—As-based mercury-removal layer is to be removed, an acid such as nitric acid, sulfuric acid, phosphoric acid+hydrogen peroxide, citric acid, or tartaric acid, or an aqueous solution thereof, is utilized. Alternatively, a mixed solution of two or more of these may be employed. Examples of the removing solution that may be given are: an aqueous solution of 70 mass % nitric acid; an aqueous solution of 36 mass % hydrochloric acid; an aqueous solution of a mixture of 85 mass % phosphoric acid and 30 mass % aqueous hydrogen peroxide; and an aqueous solution of a mixture of citric acid and 30 mass % aqueous hydrogen peroxide.

Where an Si-based mercury-removal layer is to be removed, an acid such as hydrofluoric acid, hydrofluoric acid+ammonium fluoride, or hydrofluoric acid+hydrogen peroxide, or an aqueous solution thereof, is utilized. Examples of the removing solution that may be given are: an aqueous solution of 50 mass % hydrofluoric acid; a mixed aqueous solution of 50 mass % hydrofluoric acid and ammonium fluoride; and a mixed aqueous solution of 50 mass % hydrofluoric acid and 30 mass % aqueous hydrogen peroxide.

Removal of mercury-removal layers, although not particularly restricted, can be performed by, for example, methods such as immersion-rinsing with a corresponding removing solution, or by ultrasonic cleaning. Subsequent to the elimination of the mercury-removal layer using a removing solution, removing solution that is extant is washed off with water. In cases where the mercury-removal layer is two-or-more-fold, the steps of removing the mercury-removal layer using a corresponding removing solution and the water wash are repeated. An indium-containing wafer having undergone a final water wash is dried for delivery as a finished article. There are no particular restrictions on the drying method, and nitrogen gas blowing, vacuum drying, heat drying, or the like can be adopted as appropriate insofar as the electrical characteristics of the indium-containing wafer are not compromised.

EMBODIMENTS

Embodiment 1

Figure 3:
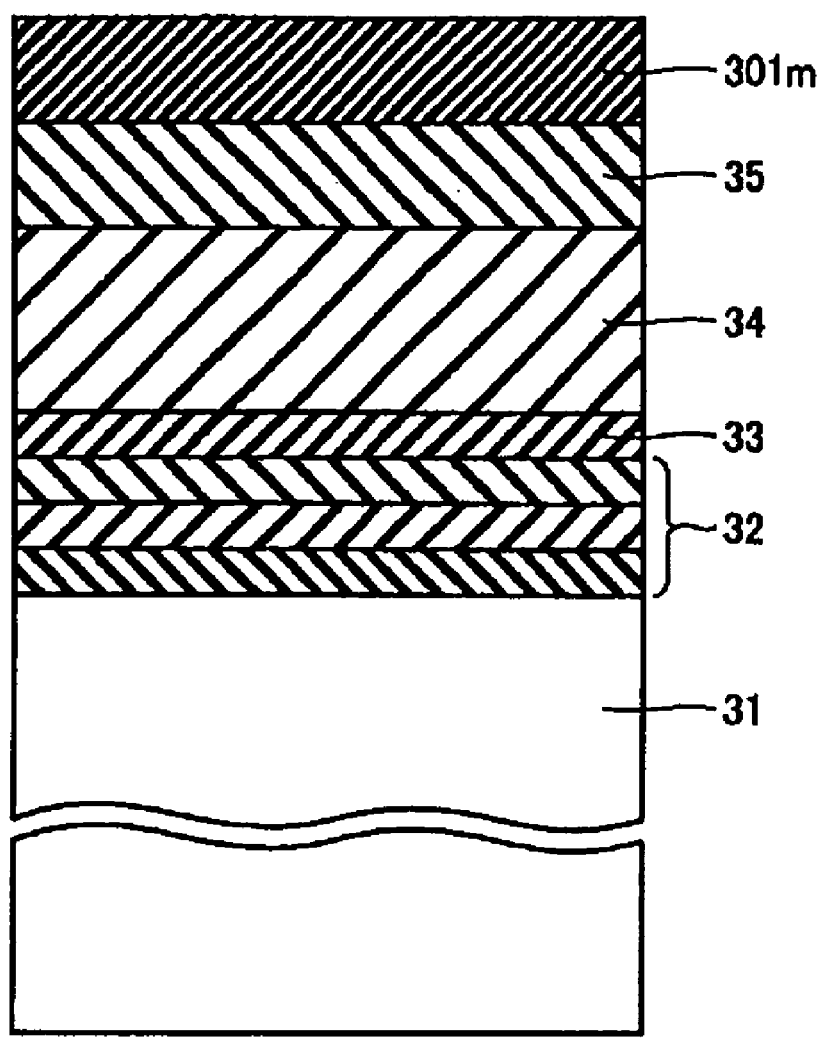
FIG. 3 is a schematic sectional view illustrating an indium-containing wafer according to one embodiment of the present invention.

FIG. 3 illustrates one example of the present invention. As device-forming layers, a InGaAs(P)/InP/InGaAs multi-laminar structure layer 32, and InP layers 33 and 34 having two laminae differing in carrier density, and respective thicknesses of 0.5 μm and 1.2 μm, were epitaxially grown on a 50-mm-diameter n-type InP substrate 31, and on top of them InGaAs(P) [As/(As+P) mole ratio=0.7] 35, serving as an episurface layer, was epitaxially grown to have a thickness of 0.1 μm; thus an avalanche photodiode (APD) structure as an example of a semiconductor device in the present invention was obtained. With APDs the carrier density in and thickness of the InP bi-layer 33, and the uniformity thereof, are crucial in device operations.

Further, a 0.1 μm-thick InP epitaxial layer 301m, serving as a non-device-forming, mercury-removal layer, was formed on the episurface layer. The formation of the InP epitaxial layer was carried out using hydrogen gas as a carrier gas and introducing trimethylindium and phosphine source materials Into a MOVPE (metal-organic vapor phase epitaxy) furnace at a furnace pressure of 25 Torr and at a deposition temperature of 650° C. In the case where an InGaAs epitaxial layer was formed, the source materials used were trimethylindium, trimethylgallium, arsine, and disilane. The deposition rate was 2 μm/h in either case.

Figure 4A:
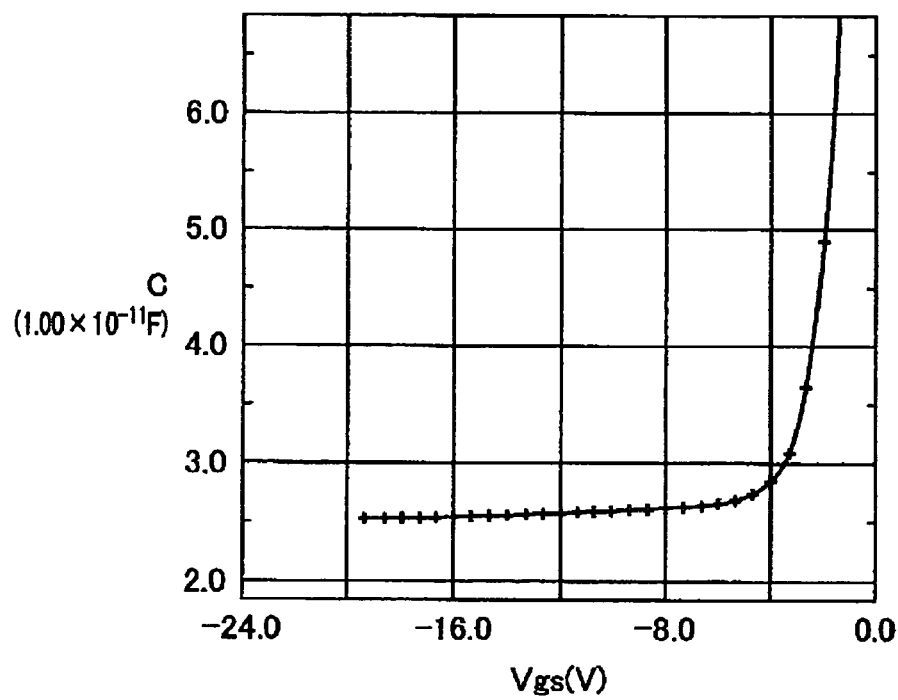
FIG. 4 is graphs plotting, for an indium-containing wafer according to one embodiment of the present invention, wherein (a) is results of mercury C-V measurement on the wafer prior to providing it with a mercury-removal layer, and (b) is carrier densities calculated thereafter at respective depths.
Figure 4B:
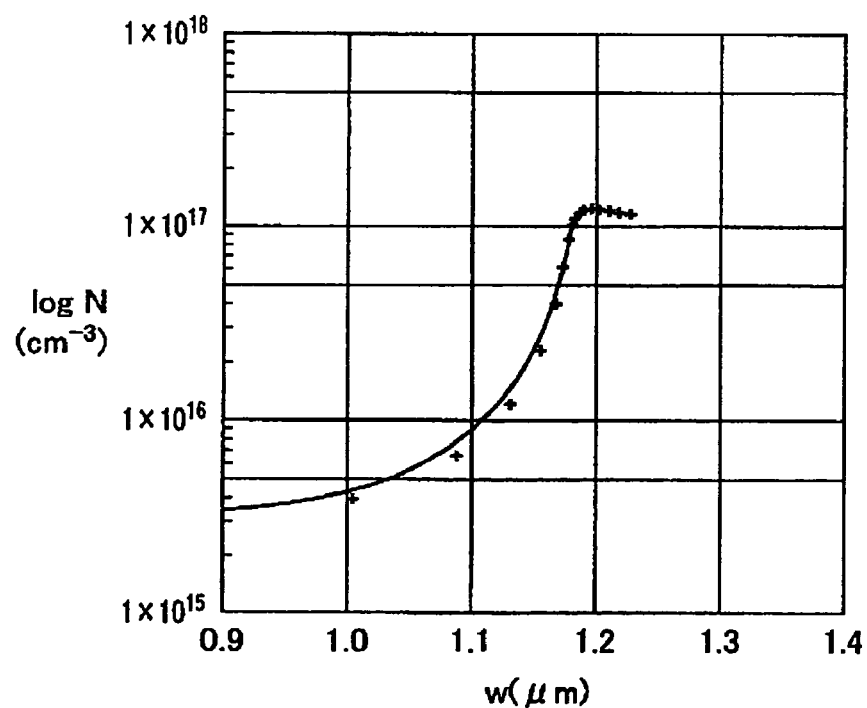
Figure 5A:
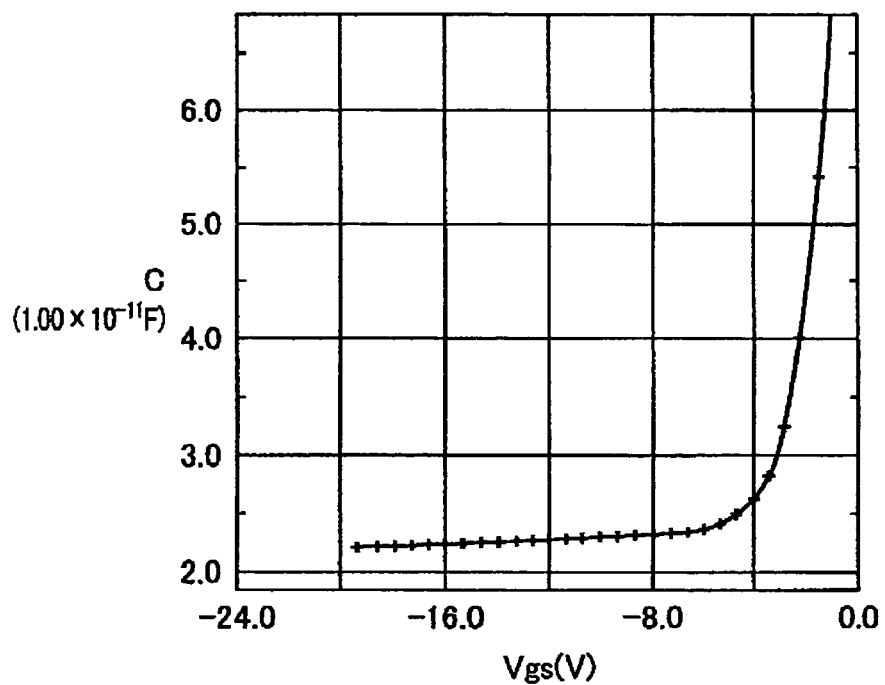
FIG. 5 is graphs plotting, for an indium-containing wafer according to one embodiment of the present invention, wherein (a) is results of mercury C-V measurement on the wafer after providing it with a mercury-removal layer, and (b) is carrier densities calculated thereafter at respective depths.
Figure 5B:
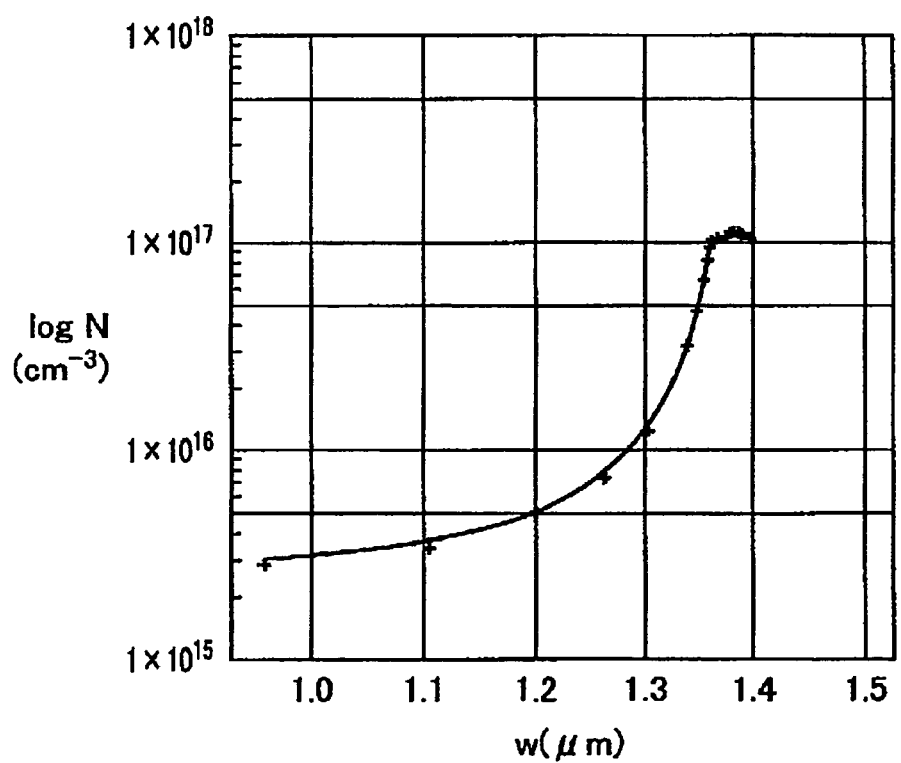

With the n-type indium-containing wafer prior to and subsequent to the formation of the mercury-removal layer, the results of a C-V measurement performed according to a mercury C-V method and the calculation results obtained therefrom for carrier densities N(w) at various depths of the indium-containing wafer are plotted in FIG. 4 and FIG. 5. In both figures (a) shows a C-V curve with the horizontal axis representing potential difference V (units: V) between the inner and outer electrodes and the vertical axis representing electric capacity C (units: F), while (b) shows an N-w curve with the horizontal axis being depth w (units: μm) from the surface of the indium-containing wafer and the vertical axis being the logarithm of carrier density N (units: cm$^{-3}$). From a comparison between both figures it is evident that high-precision results were obtained as to the carrier density, thickness, and the uniformity thereof in the area corresponding to the InP bi-layer layer 33, regardless of the presence or absence of the mercury-removal layer.

Herein, the C-V measurement was performed by applying the potential difference of the inner electrode with respect to the outer electrode so that it changed from −0.5 V to −20.5 V in a stepwise manner. The step widths were 0.1 V from −0.5 V to −1.5 V, 0.4 V from −1.5 V to −5.5 V, and 1 V from −5.5 V to −20.5 V. The I-V measurement was performed by applying the potential difference of the inner electrode with respect to the outer electrode so that it changed from −0 V to −15 V in a stepwise manner with a step width of 0.25 V. In both cases a superimposed ac voltage with a frequency of 1 MHz and an amplitude voltage of 15 mV was applied to the inner and outer electrodes.

Next, the using a solution of a weight ratio 1:1 of 36 mass % hydrochloric acid and water as the removing solution the InP mercury-removal layer was removed, and thereafter the samples were water-washed and dried. The indium-containing wafer surface was observed with a microscope before the removal of the mercury-removal layer and after the removal of the mercury-removal layer. As shown in FIG. 6 (the longitudinal-side length of the photograph being 1700 μm), particles of mercury were observed before the removal, whereas no residual mercury was observed after the removal.

Meanwhile, the indium-containing wafer surface was immersed for 30 minutes in an equimolar solution mixture of 100 mass % high-purity nitric acid and water heated at 90° C. to 100° C. before the removal of the mercury-removal layer and after the removal of the mercury-removal layer to dissolve the mercury remaining on the indium-containing wafer surface into the solution, mixture and thereafter the solution mixture underwent ICP (inductively coupled plasma) mass spectrometry for mercury. At the same time an indium-containing wafer that was not brought into contact with mercury was subjected to a control test in a similar manner. Herein, the ICP mass spectrometry method refers to a method in which qualitative and quantitative analyses are carried out by introducing into a mass spectroscope ionized atoms copiously generated in an ICP light source. The results of the ICP mass spectrometry are set forth in Table II.

TABLE II

| | Detected amount of mercury (ng) | |
|---|---|---|
| | Before removal of mercury-removal layer | After removal of mercury-removal layer |
| Sample 1 | 18 | <0.05 (Detection limit) |
| Sample 2 | 14.5 | <0.05 (Detection limit) |
| Sample 3 | 12 | <0.05 (Detection limit) |
| Control test | <0.05 (Detection limit) | |

As indicated in Table II, it was confirmed that mercury can be completely removed by a mercury removal operation utilizing removal of the mercury-removal layer. The concentration of mercury in the foregoing solution mixture provided for the ICP mass spectrometry also proved to be considerably lower than 50 ng/l, the limit defined by the Water Pollution Control Law, meaning that the indium-containing wafer that has been subjected to the mercury removal operation using the removal of the mercury-removal layer does not cause any environmental burden associated with mercury.

It should be noted that in an etching rate confirmation test that was implemented separately, in which a sample with a 3 μm InP single layer and a sample with a 1 μm InGaAs(P) single layer were treated in the foregoing removing solution (the removing solution in which 36 mass % hydrochloric acid and water are blended at a weight ratio 1:1) for 1 minute, the InP single layer was etched 2.2 μm whereas the InGaAs(P)single layer was etched 0.01 μm, confirming that the relative etching speed was 220 times faster.

Embodiment 2

Figure 7:
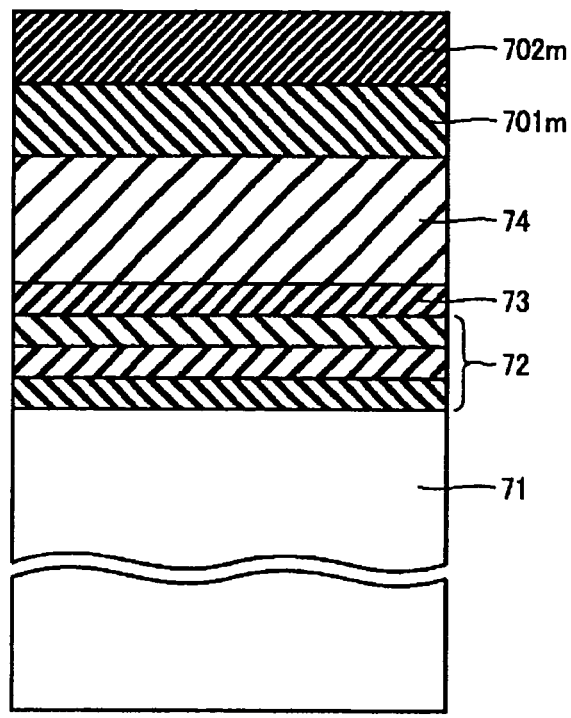
FIG. 7 is a schematic sectional view illustrating an indium-containing wafer according to another embodiment of the present invention.

FIG. 7 illustrates another example of the present invention. An InGaAs(P)/InP/InGaAs multi-layered structure layer 72, and InP layers 33 and 34 having two laminae differing in carrier density, and respective thicknesses of 0.5 μm and 1.2 μm were epitaxially grown on a 50-mm-diameter n-type InP substrate 71. In the present example the 1.2 μm-thick InP layer corresponds to the episurface layer. Further on top of it, a twofold mercury-removal layer, a 0.1 μm-thick InGaAs layer 701m and a 0.1 μm-thick InP layer 702m, were epitaxially grown in sequence in the same fashion as in Embodiment 1.

The n-type indium-containing wafer prior to and subsequent to the formation of the mercury-removal layer was subjected to a C-V measurement in a similar manner to that in Embodiment 1, and carrier densities N(w) at various depths win the indium-containing wafer were calculated. In this case too, high-precision results were obtained regardless of the presence or absence of the mercury-removal layer.

Next, the outer mercury-removal layer InP was removed in a similar manner to that in Embodiment 1 whereas the inner mercury-removal layer InGaAs was removed using a solution of a mass ratio of 1:2 of 70 mass % nitric acid and water, and thereafter the sample was water-rinsed and dried. The episurface layer of the indium-containing wafer was then observed with a microscope and underwent ICP mass spectrometry, wherein no residual mercury was recognized.

Embodiment 3

Figure 8:
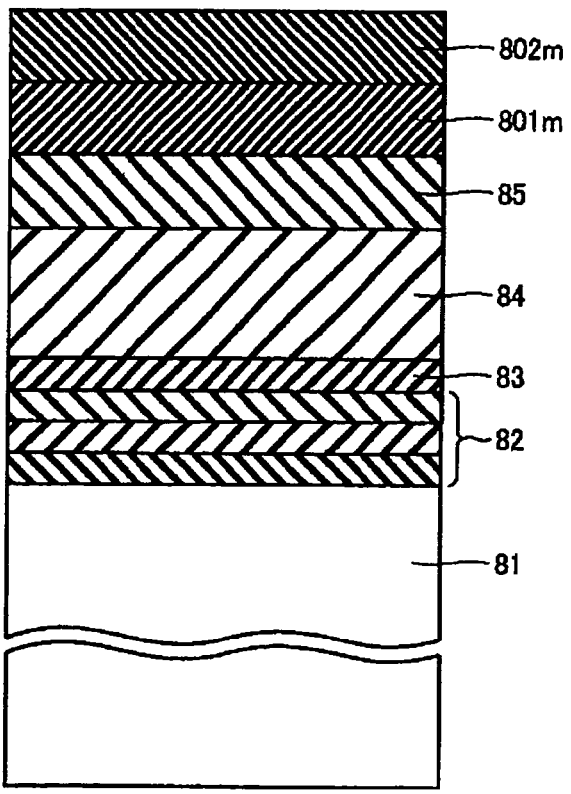
FIG. 8 is a schematic sectional view illustrating an indium-containing wafer according to yet another embodiment of the present invention.

FIG. 8 illustrates yet another example of the present invention. An InGaAs(P)/InP/InGaAs multi-layered structure layer 82, and InP layers 83 and 84 having two laminae differing in carrier density, and respective thicknesses of 0.5 μm and 1.2 μm were epitaxially grown on a 50-mm-diameter n-type InP substrate 81, and on top of it a 0.1 μm-thick InGaAs(P) [As/(As+P) mole ratio=0.7] 85, serving as an episurface layer, was epitaxially grown while a 0.1 μm-thick InP epitaxial layer 801m was formed, which served as an inside mercury-removal layer. Further, on top of it, a 0.1 μm-thick InAlAs epitaxial layer 802m was formed, which served as an outer mercury-removal layer. The source materials used for growing this layer were trimethylaluminum, trimethylindium, arsine, and disilane.

The n-type indium-containing wafer prior to and subsequent to the formation of the mercury-removal layers was subjected to a C-V measurement in a similar manner to that in Embodiment 1, and carrier densities N(w) at various depths w in the indium-containing wafer were calculated. In this case too, high-precision results were obtained regardless of the presence or absence of the mercury-removal layer.

Next, the outer mercury-removal layer InAlAs was removed using a aqueous solution mixture of a mass ratio of 1:2:20 of 70 mass % nitric acid, 30 mass % aqueous hydrogen peroxide, and water, whereas the inner mercury-removal layer InP was removed in a similar manner to that in Embodiment 1, and thereafter the sample was water-washed and dried. The episurface layer of the indium-containing wafer was then observed with a microscope and underwent ICP mass spectrometry, wherein no residual mercury was recognized.

It should be noted that the foregoing examples involve the handling of mercury, and therefore safety and hygienic considerations are necessary. In particular, immediately after the C-V measurement mercury remains in the wafer; for this reason, protective wear such as protective gloves and protective eye glasses, as well as implementation of local ventilation are indispensable in order to prevent the mercury from coming into contact with the human body and from being inhaled. Additionally, in the removal of the mercury-removal layer, appropriate handling for mercury is required since the removing solution contains mercury. Further, due to the possibility of mercury adhering to the jigs used, sufficient operational management and washing are crucial.

The embodiments and samples disclosed herein are in all aspects illustrative and not to be construed as restrictive. The scope of the present invention is defined by not the foregoing description but the appended claims, which are intended to include all modifications and equivalents of the claims.

INDUSTRIAL APPLICABILITY

The present invention thus makes it possible to evaluate electrical characteristics of indium-containing wafers with high precision and in a non-destructive way using a mercury C-V method or the like regardless of the presence or absence of mercury-removal layers, and to remove mercury that has adhered by removing the mercury-removal layer; thus, it makes available indium-containing wafers whose electrical characteristics according to objectives are guaranteed.

The invention claimed is:

1. A semiconductor device comprising:
an indium-containing wafer;
device-forming layers deposited on said indium-containing wafer, said layers defining an episurface device-forming layer; and
a dissolvable, mercury-adhering non-device forming layer composed of InGaAs(P) for dissolving in a nitric acid, sulfuric acid, or phosphoric acid+aqueous hydrogen peroxide removing solution, said mercury-adhering layer comprising at least two laminae each of composition having an As/(As+P) mole ratio different from that of the immediately adjacent other lamina, such that the difference between the As/(As+P) mole ratio of one lamina and the As/(As+P) mole ratio of the immediately adjacent other lamina is 0.1 or greater, and said mercury-adhering layer formed, as the outermost layer on the semiconductor device, on said episurface device-forming layer, for carrying a mercury electrode for profiling characteristics of the semiconductor device-forming layers.

2. A semiconductor device comprising:
an indium-containing wafer;
device-forming layers deposited on said indium-containing wafer, said layers defining an episurface device-forming layer; and
a dissolvable, mercury-adhering, non-device forming layer composed of InGaP(As) for dissolving in a hydrochloric acid removing solution comprising at least two laminae each of composition having a P/(P+As) mole ratio different from that of the immediately adjacent other lamina, such that the difference between the P/(P+As) mole ratio of one lamina and the P/(P+As) mole ratio of the immediately adjacent other lamina is 0.1 or greater, and said mercury-adhering layer formed, as the outermost layer on the semiconductor device, on said episurface device-forming layer, for carrying a mercury electrode for profiling characteristics of the semiconductor device-forming layers.

3. A semiconductor device comprising:
an indium-containing wafer;
device-forming layers deposited on said indium-containing wafer, said layers defining an episurface device-forming layer; and
a dissolvable, mercury-adhering, non-device forming layer composed of at least two laminae, one of InGaAs(P) and an immediately adjacent other of InGaP(As), each of composition such that the difference between the As/(As+P) mole ratio of the InGaAs(P) lamina and the As/(As+P) mole ratio of the InGaP(As) lamina is 0.1 or greater, said mercury-adhering layer formed, as the outermost layer on the semiconductor device, on said episurface device-forming layer, for carrying a mercury electrode for profiling characteristics of the semiconductor device-forming layers
said mercury-adhering layer must be removed from the semiconductor device in order to render operable the device formed by said device-forming layers.

* * * * *